United States Patent [19]

Yurek et al.

[11] Patent Number: 5,439,880
[45] Date of Patent: Aug. 8, 1995

[54] PREPARATION OF SUPERCONDUCTING OXIDES BY OXIDIZING A METALLIC ALLOY

[75] Inventors: Gregory J. Yurek, Wellesley Hills; John B. Vander Sande, Newbury, both of Mass.

[73] Assignee: Massachusetts Institute of Technology, Cambridge, Mass.

[21] Appl. No.: 56,605

[22] Filed: May 3, 1993

Related U.S. Application Data

[63] Continuation of Ser. No. 794,962, Nov. 20, 1991, abandoned, which is a continuation of Ser. No. 61,233, Jun. 10, 1987, Pat. No. 5,204,318, which is a continuation-in-part of Ser. No. 31,407, Mar. 27, 1987, Pat. No. 4,826,808.

[51] Int. Cl.$^6$ .............. HA01 12/00; H01L 39/12
[52] U.S. Cl. .................... 505/492; 505/742; 505/430; 505/450; 505/725; 505/433; 505/473; 505/475; 505/490; 505/491; 252/518; 252/521; 148/277; 423/593
[58] Field of Search ............. 252/521, 518; 148/277; 505/100, 725, 736, 742, 430, 450; 423/593

[56] References Cited

U.S. PATENT DOCUMENTS

| | | |
|---|---|---|
| 3,427,154 | 2/1969 | Mader et al. |
| 3,796,553 | 3/1974 | Daunt .................. 29/191.2 |
| 3,815,224 | 6/1974 | Pickus et al. .............. 29/599 |
| 3,932,315 | 1/1976 | Sleight ................ 252/521 |
| 3,954,459 | 5/1976 | Schreiner et al. ........... 75/206 |
| 4,000,014 | 12/1976 | Winter ............... 148/11.5 R |
| 4,001,146 | 1/1977 | Horowitz ............ 252/514 |
| 4,050,147 | 9/1977 | Winter et al. ............ 29/599 |
| 4,171,464 | 10/1979 | Steyert, Jr. ............. 174/126 |
| 4,264,358 | 4/1981 | Johnson et al. ......... 75/134 F |
| 4,339,508 | 7/1982 | Tsuya et al .............. 428/606 |
| 4,411,959 | 10/1983 | Braginski et al. ............ 428/558 |
| 4,540,546 | 9/1985 | Giessen ................ 420/590 |
| 4,701,301 | 10/1987 | Kuwahara ............... 427/38 |
| 4,713,360 | 12/1987 | Newkirk ............... 501/87 |
| 4,770,701 | 9/1988 | Henderson et al. ......... 75/232 |
| 5,078,810 | 1/1992 | Tanaka et al. ........... 148/203 |

FOREIGN PATENT DOCUMENTS

| | | |
|---|---|---|
| 0283024 | 3/1988 | European Pat. Off. |
| 0287258 | 4/1988 | European Pat. Off. |
| 56-085814 | 7/1981 | Japan . |
| 611813 | 11/1948 | United Kingdom . |
| WO88/08338 | 11/1988 | WIPO . |

OTHER PUBLICATIONS

Ogushi "Superconductivity in Nb-Ge-Al-O Films Above 44K" *Appl. Phys. Lett* v. 48(17) Apr. 28, 1986 pp. 1157-1158.

Chu "Evidence for Superconductivity above 40K in La-Ba-Cu-O . . . " *Phys. Rev. Lett.* vol. 58(4) Jan. 26, 1987 pp. 405-407.

"$EuBa_2Cu_3O_x$ Produced by Oxidation of a Rapidly Solidified Precursor Alloy: An Alternative Preparation Method for High $T_c$ Ceramic Superconductors" Haldar et al. *Appl. Phys. Lett.* 51(7), pp. 538-539 (Aug. 17, 1987).

"Glassy $Yb_{0.17}Ba_{0.33}Cu_{0.50}$ Alloy as Precursor for the High $T_c$ Oxide Superconductor $Yb_1Ba_2Cu_3O_x$" Lu et al. *Mat. Lett., Acc* (Jun. 1987).

"Formation of Perovskite Surface Layers by Oxidation of Cu-La-Sr Alloys" Gruen et al. *J. Electrochem. Soc.* 134(6), pp. 1588-1589 (Jun. 1987).

"Preparation of a High $T_c$ Superconductor by Oxidation of an Amorphous $La_{1.8}Sr_{0.2}Cu$ Alloy Ribbon in Air" Matsuzaki et al. *Jap. J. Appl. Phys.,* 26(4), pp. L334-336 (Apr. 1987).

(List continued on next page.)

*Primary Examiner*—Paul Lieberman
*Assistant Examiner*—Mark Kopec
*Attorney, Agent, or Firm*—Choate, Hall & Stewart

[57] ABSTRACT

A method of preparing a superconducting oxide by combining the metallic elements of the oxide to form an alloy, followed by oxidation of the alloy to form the oxide. Superconducting oxide-metal composites are prepared in which a noble metal phase intimately mixed with the oxide phase results in improved mechanical properties. The superconducting oxides and oxide-metal composites are provided in a variety of useful forms.

14 Claims, No Drawings

OTHER PUBLICATIONS

"Weak Point of Ceramics Will be Overcome" Masumoto et al. *Asahi Shinbun*, Mar. 10, 1987.

"Superconductivity: A new Era of Discovery for Electricity" Gleick. *The New York Times*, pp. C1–C6 (Mar. 10, 1987).

"Superconductivity at 40K in the Oxygen—Defect Perovskites $La_{2-x}Sr_xCuO_{4-y}$" Tarascon et al, *Science* 235, pp. 1373–1376 (Mar 13, 1987).

"High Pressure Study of the New Y–Ba–Cu–O Superconducting Compound System" Hor et al. (Mar. 2, 1987).

"Superconductivity at 93K in a New Mixed Phase Y–Ba–Cu–O System at Ambient Pressure" Wu et al. (Mar 3, 1987).

"Bulk Superconductivity at 36K in $La_{1.8}Sr_{0.2}CuO_4$" Cava et al. *Phys. Rev. Lett.* 58(4), pp. 408–410 (Jan. 26, 1987).

"Superconductivity at 93K in a New Mixed Phase Y–Ba–Cu–O System at Ambient Pressure" Wu et al. (Mar. 2, 1987).

"High $T_c$ Superconductors—Composite Wire Fabrication" Jin et al. *Appl. Phys Lett.* 51(3), pp. 203–204 (Jul. 20, 1987).

"Superconductivity and Phase Stability in the heavy Rare Earth Quanternary Compounds $(RBa_2Cu_3)_7$ (R=Ho, Er, Tm, Yb, Lu)" Ku et al. High Temperature Superconductors ed, D. U. Gubser and M. Schluter (Proceedings of Sumposium S, 1987 MRS Spring Meeting, EA–11, Apr. 23–24, 1987).

"Preparation and Properties of the Compounds $Ln_2CuO_4$(Ln=La, Pr, Nd, Sm, Eu, Gd) and Some of Their Solid Solutions" Shaplygin et al. *Russ. J. Inorg. Chem.*, 24(6), pp. 820–824 (Oct. 20, 1978).

"Composition Dependence of the High Temperature Superconductivity in (Ba, Sr)–La–(Hg, Ag)–Cu–O System with $K_2NiF_4$-Type Structure" Saito et al. *Jap. J. Appl. Phys.*, 26(3), pp. L223–224 (Mar. 1987).

"Process for Producing Interwoven Two—Phase Materials and Their Use to Produce Porous Metals and Compounds" Rapp. Invention Disclosure Sheet. *Ohio State University* (Dec. 26, 1970.

"Possible High $T_c$ Superconductivity in the Ba–La–Cu–O System" Bednorz et al. *Z. Phys. B.—Condensed Matter*, 64, pp. 189–193 (Apr 1986).

"American Superconductor Corporation: Building the First New Superconductor Company" McKinney, *Supercurrents* 2, pp. 21–24 (Feb. 1988).

"Rare—Earth Doping of High $T_c$ Superconducting Perovskites" McKinnon et al. (*Proceedings of Symposium S*, 1987 MRS Spring Meeting, Apr. 23–24, 1987).

"High $T_c$ Superconductivities of $A_2Ba_4Cu_6O_{24+y}$" Tsurumi et al. *Jap. J. Appl. Phys.* 26(5), pp. L856–857 (May 1987).

"Superconductivity at 90 K in a multi—phase oxide of Y–Ba–Cu", J. M. Tarascon et al., Science, vol. 235, Mar. 1987, pp. 1373–1376.

"Electricity Rushes Into a New Era of Discovery", James Gleick, The New York Times, C1, Mar. 10, 1987.

"Weak Points of Ceramics Will Be Overcome", English Translation from Asahi Newspaper, Mar. 10, 1987.

"Preparation of a High $T_c$ Superconductor by Oxidization of an Amorphous $La_{1.8}Sr_{0.2}Cu$ Alloy Ribbon in Air", Kunio Matsuzaki et al., The Research Institute for Iron, Steel and Other Metals, 26, L334, Apr. 1987.

"Formation of Perovskite Surface Layers by Oxidation of Cu–La–Sr Alloys", D. M. Gruen et al., Journal of the Electrochemical Soc., 134, 1588 (1987).

"Glassy $Yb_{0.17}Ba_{0.33}Cu_{0.50}$ Alloy as Precursor For The High–$T_c$ Oxide Superconductor $Yb_1Ba_2Cu_3O_x$", Y.Z. Lu et al., Materials Letters, 5, 380 (1987).

Invention Disclosure Sheet, "Process for Producing Interwoven Two—Phase Materials and Their Use to Produce Porous Metals and Compounds", Robert A. Rapp, The Ohio State University, Dec. 26, 1970.

"Possible High $T_c$ Superconductivity in the Ba–La–Cu–O System", J. G. Bednorz, Condensed Matter, 64, 189, Spring 1986.

"Superconductivty At 93K In A New Mixed Phase Y–Ba–Cu–O Compound System At Ambient Pressure", M. K. Wu et al., Phys. Rev. Letters, 58, 908 (1987).

"$EuBa_2Cu_3O_x$ produced by oxidation of a rapidly solidified precursor alloy: An alternative preparation method for high $T_c$ ceramic superconductors", R. Haldar et al., Appl. Phys. Lett., 51, 538, Aug. 1987.

"Rare—Earth Doping Of High $T_c$ Superconducting Perovskites", W. R. McKinnon et al. Extended Abstracts High Temperature Superconductors, Proceedings of Symposium S, 1987 Spring Meeting of the Materials Research Society.

(List continued on next page.)

OTHER PUBLICATIONS

"Superconductivity and Phase Stability In The Heavy Rare Earth Quaternary Compounds $Rba_2Cu_3O_7$ (R=Ho, Er, Tm Yb, Lu)", H. C. Ku et al., High Temperature Superconductors, Proceedings of Symposium S, 1987 MRs Spring Meeting (1987).

"Superconducting $BaPb_{1-x}Bi_xO_3$ Ceramic Films Prepared By R.F. Sputtering", L. R. Gilbert, Thin Solid Films, 54, 129, Apr. 1978.

"Composition Dependence of the High Temperature Superconductivity in (Ba, Sr)-La-(Hg, Ag)-Cu-O System with $K_2NiF_4$-Type Structure", Saito et al., Japanese Journal of Applied Physics, 26, L856, Mar. 1987.

"High $T_c$ Superconductivities of $A_2Ba_4Cu_6O_{14+y}$", Shigeyuki Tsurumi et al., Japanese Journal of Applied Physics, 26, L856, May 1987.

"Preparation and Properties of the Compounds $Ln_2CuO_4$ (Ln=La, Pr, Nd, Sm, Eu, GD) and Some of Their Solid Solutions", I. S. Shaplygin et al., Russian Journal of Inorganic Chemistry, 24, 820, (no month) 1979.

"High Pressure Study Of The New Y-Ba-Cu-O Superconducting Compound System", P. H. Hor et al., Physical Review Letters, 58, 911 (1987).

"Building The First New Superconductor Company", George McKinney, III, American Research and Development, Supercurrents, p. 21, Feb. 1988.

"Atmosphere effects on $Nb_3Ge$ growth and superconductivity", R. A. Sigabee, Applied Physics Letters, 29, 211, Aug. 1976.

"Superconductivity in Nb-Ge films above 22 K*", J. R. Gavaler, Applied Physics Letters, 23, 480, Oct. 1973.

"Oxygen distribution in sputtered Nb-Ge films", J. R. Gavaler et al., Applied Physics Letters, 28, 237, Feb. 1976.

"The nucleation of high-$T_c$ $Nb_3Ge$ in the presence of impurities", J. R. Gavaler et al., Appl. Phys. Lett, 33, 359, Aug. 1978.

Ogushi et al., "Superconductivity in Nb-Ge-Al-O films above 44 K", Appl. Phys. Lett. 48(17)1167 (Apr. 28, 1986).

Matsuzik "Preparation of a High $T_c$ Superconductor" Jap. Jnl. Appl. Phys. vol.26(4) Apr. 1987, pp. 2334-2346.

PREPARATION OF SUPERCONDUCTING OXIDES BY OXIDIZING A METALLIC ALLOY

This is a continuation of application Ser. No. 07/794,962 filed on Nov. 20, 1991 now abandoned which is a continuation of U.S. Ser. No. 07/061,233 filed Jun. 10, 1987 U.S. Pat. No. 5,204,318 which is a continuation-in-part of U.S. Ser. No. 07/031,407 filed Mar. 27, 1987 U.S. Pat. No. 4,826,808.

BACKGROUND OF THE INVENTION

This invention relates to superconducting materials.

Superconductors are materials having essentially zero resistance to the flow of electrons below a certain critical temperature, $T_c$. It is known that certain metal oxides, e.g., $La_{2-x}Ba_xCuO_{4-y}$, $La_{2-x}Sr_xCuO_{4-y}$, $Ba_2YCu_3O_{9-y}$, etc. exhibit superconductivity. It has also been discovered by the inventors herein that a europium-barium-copper oxide compound in which the europium, barium and copper are in a 1-2-3 ratio, that is, $EuBa_2Cu_3O_x$, ratio exhibits superconductivity with a transition temperature at approximately 85° K. It is desirable to provide such oxides in forms, e.g., wires or thin films, that permit practical utilization of their superconductive property.

SUMMARY OF THE INVENTION

In general, the invention features in one aspect combining the metallic elements of the desired superconducting oxide to form an alloy, and oxidizing the alloy to form the superconducting oxide. The alloy can be formed, e.g., into a wire, ribbon, sheet, rod, or ring. The solid alloys used to make these articles can be produced from the liquid state by rapid or conventional solidification processing techniques to produce, e.g., ribbons, powders, flakes, ingots, sheets, or cast shapes. Rapid solidification processing techniques include melt spinning to produce ribbons and inert gas atomization to produce powders or spray deposits. Conventional solidification processing techniques include chill casting, ingot casting, die casting, and centrifugal casting. Thermal-mechanical processing of the solid alloys can be employed to form them into final, useful shapes before oxidizing the alloys into the superconducting oxide. Thermal-mechanical processing techniques include wire drawing, extrusion, co-extrusion, hot isostatic pressing, and rolling.

The alloy can also be provided in the form of a relatively thick coating, e.g., on a tube, wire, rod, or shaped article such as a ring. Relatively thick coatings of the alloys can be produced by coextrusion of the alloy powder with a billet of a substrate metal or metal alloy to form wires, rods, or tubes. Alloy coatings can also be produced by plasma spraying or sputtering the alloy constituents onto a substrate metal or metal alloy that can be in many useful shapes, e.g., a tube formed into the shape of a ring. Furthermore, alloy coatings can be produced by hot dipping the substrate metal or metal alloy, e.g., in a wire form, in the liquid alloy.

The alloy before oxidation can also be in the form of a thin film on a metallic, insulating, or semiconducting substrate, e.g., as used in a Josephson junction device of an integrated circuit. Thin films of the alloy can be produced by chemical vapor deposition, vacuum evaporation, sputtering, molecular beam epitaxy, ion-beam mixing, and ion implantation.

In another aspect the invention features a superconducting oxide-metal composite in which a noble metal phase (noble in the sense that its oxide is thermodynamically unstable under the reaction conditions employed relative to the superconducting oxide that forms) is intimately mixed with a superconducting oxide phase to achieve desired mechanical properties. In preferred embodiments, the noble metal is present initially as an alloying element with the metallic elements of the oxide; the alloy is then oxidized under conditions that convert the metallic elements of the oxide to the superconducting oxide without oxidizing the noble metal. The latter precipitates as a finely divided, substantially pure metal phase (rather than as a second oxide phase) that is intimately mixed with the superconducting oxide in the final composite, the oxide phase being continuous (or nearly so) throughout the composite. The noble metal may be a metallic element different from the metallic elements of the oxide, e.g., Au, Pt, Pd, or Ag, but may also be an excess amount (stoichiometrically) of one of the metallic elements of the oxide, e.g., Cu. The superconducting oxide-metal composites exhibit improved mechanical properties (strength, ductility, etc.) because these properties are dominated by the metallic phase, rather than by the brittle oxide phase.

Examples of suitable oxides are described in the following references, hereby incorporated by reference and made part of this application: Chu et al. (1987) Phys. Rev. Lett. 58(4) 405–07; Cava et al. (1987) Phys. Rev. Lett. 58(4) 408–10; Wu et al. (1987) "Superconductivity at 93K in a New Mixed Phase Y-Ba-Cu-O Compound System at Ambient Pressure" (submitted for publication, copy attached); Hot et al. (1987) "High Pressure Study of the New Y-Ba-Cu-O Superconducting Compound System" (submitted for publication, copy attached); Tarascon et al. (1987) "Superconductivity at 90K in a Multi-Phase Oxide of Y-Ba-Cu" (submitted for publication, copy attached); Gleick, "Superconductivity: A New Era of Discovery for Electricity," N.Y. Times, Mar. 10, 1987; and Tarascon et al. (1987) Science 235: 1373–76. They include, e.g., oxides of La, Ba, and Cu; La, Sr, and Cu; Lu, Ba, and Cu; Lu, Sr, and Cu; and Y, Ba, and Cu. The invention is of course applicable to any superconducting oxide. A europium-barium-copper oxide has been found to be particularly preferred, namely $EuBa_2Cu_3O_x$. This invention encompasses other compounds including europium.

Other features and advantages of the invention will be apparent from the following description of the preferred embodiments thereof, and from the claims.

DESCRIPTION OF THE PREFERRED EMBODIMENTS

The preferred embodiments of the invention are described by way of the following examples.

EXAMPLE 1

A superconducting oxide of La, Ba, and Cu is prepared as follows.

Pure La, Ba, and Cu (73.3 wt. % La, 8.1 wt. % Ba, and 18.6 wt. % Cu) are melted under vacuum in an induction melting furnace in a melt spinning apparatus. The liquid alloy is heated to approximately 800° C., and then melt spun to produce a ribbon of the alloy.

The alloy ribbon is oxidized by heating at a constant temperature of 450° C. in flowing pure oxygen gas until it is almost completely oxidized. The temperature is then raised to 1000° C. and held there until the sample weight is approximately constant and the oxide is homogeneous with respect to composition. The temperature is then reduced to 490° C. and maintained at this temperature for approximately 18 h. The temperature is then reduced to room temperature.

EXAMPLE 2

A superconducting oxide-metal composite, in which the oxide phase is an oxide of La, Ba, and Cu, and the metallic phase is a noble metal such as Ag, is prepared following the procedure described in Example 1 except that Ag metal is melted together with La, Ba, and Cu to form the alloy, the initial oxidation step is at 400° C., and the maximum oxidation temperature is less than the melting point of Ag metal (960° C.). During oxidation Ag is not oxidized, but rather precipitates out as a separate phase of substantially pure Ag. The metal phase, by being intimately mixed with the oxide phase, acts as a "skeleton" in the composite, resulting in improved ductility and strength.

EXAMPLE 3

A superconducting oxide-metal composite is prepared as in Example 2 except that the noble metal is excess Cu, rather than Ag metal. During oxidation, the temperature, oxygen partial pressure, and reaction time are selected to achieve the oxide stoichiometry required for superconductivity without oxidizing the excess Cu metal to $Cu_2O$ and/or CuO. Thus, the final composite consists of a superconducting La-Ba-Cu oxide phase and a substantially pure Cu metallic phase.

EXAMPLE 4

The alloy ribbon prepared in Example 1, 2, or 3 can be formed into a shape, e.g., a ring or coil, prior to oxidation and then oxidized to provide a superconducting oxide or oxide-metal composite in the desired shape.

EXAMPLE 5

A superconducting oxide or oxide-metal composite is prepared as in Examples 1, 2, or 3 but in the form of a wire by providing the alloy initially as a hot isostatically pressed compact of a rapidly solidified powder, ground-up rapidly solidified ribbon, or cast billet, and then forming it into a wire by wire drawing. The wire is then shaped by winding it around a metallic core and oxidized to prepare superconducting magnets. The wire can also be oxidized prior to shaping.

EXAMPLE 6

The alloy prepared in Examples 1, 2, or 3 is prepared as a rapidly solidified powder, rather than as a ribbon, and then hot isostatically pressed to form a useful shape, e.g., a ring. The shaped article is then oxidized to form a superconducting oxide or oxide-metal composite article.

EXAMPLE 7

A superconducting oxide or oxide-metal composite is prepared as in Example 1, 2, or 3 except that the alloy is prepared by melting, then atomizing the liquid alloy using inert gas atomization to form a powder. The alloy powder is coextruded with a billet of a metal or metal alloy to yield a composite wire, rod, or tube. The coextruded product consists of a metal core coated with the alloy. The tube may be coated on the inside or outside surface, or both. The coating is then oxidized to form the superconducting oxide or oxide-metal composite. In the case of the superconducting oxide-metal composites, the metal or metal alloy substrate can form a metallurgical bond with the noble metal phase of the composite, thereby promoting adhesion of the coating.

EXAMPLE 8

An alloy coating is prepared by running a metal or metal alloy wire through a bath of the molten alloy to form the coating. The hot dipping process is carried out in vacuo or under an inert atmosphere to avoid premature oxidation of the alloy. The coating is then oxidized to form the superconductive oxide or oxide-metal composite as in Examples 1, 2, or 3.

EXAMPLE 9

An alloy is prepared as in Examples 1, 2, or 3 but in the form of a coating on a substrate by spray deposition, sputtering, or plasma spraying. Oxidation produces a superconductive oxide or oxide-metal composite coating.

EXAMPLE 10

A thin film of the alloy described in Examples 1, 2, or 3 is deposited by, e.g., chemical vapor deposition, vacuum evaporation, sputtering, molecular beam epitaxy, ion beam mixing, or ion implantation, on a metallic, insulating, or semiconducting substrate. The thin film is then oxidized to form a thin film superconducting oxide or metal-oxide composite. This procedure is particularly useful in integrated circuit fabrication, and can be used to produce, e.g., Josephson junction devices.

Other embodiments ere within the following claims. We claim:

1. A method of preparing a superconducting oxide comprising the steps of:
   combining the metallic elements of said superconducting oxide to form an alloy having substantially stoichiometric proportions needed to form said superconducting oxide; and
   oxidizing said alloy to form said superconducting oxide, wherein said alloy is formed into a shape prior to said oxidation step, said shape comprising a wire, ribbon, sheet, rod, or ring.

2. The method of claim 1 wherein said wire is wrapped around a metallic core in the preparation of a superconducting magnet.

3. The method of claim 1 wherein said alloy is formed into said shape by wire drawing, extrusion, coextrusion, hot isostatic pressing, or rolling.

4. The method of claim 1 wherein said alloy is formed by melting said metallic elements together, followed by rapid solidification processing.

5. The method of claim 4 wherein said rapid solidification processing comprises melt spinning or inert gas atomization.

6. The method of claim 1 wherein said alloy is formed by melting said metallic elements together, followed by casting.

7. The method of claim 1 wherein said metallic elements are chosen from the group consisting of La, Ba, Cu, Y, and Sr.

8. The method of claim 1 wherein said metallic elements comprise La, Ba, and Cu.

9. The method of claim 1 wherein said metallic elements comprise La, Sr, and Cu.

10. The method of claim 1 wherein said metallic elements comprise Y, Ba, and Cu.

11. The method of claim 1 wherein said metallic elements comprise Lu, Ba, and Cu.

12. The method of claim 1 wherein said metallic elements comprise Lu, Sr, and Cu.

13. The method of claim 1 wherein said metallic elements comprise europium, barium and copper.

14. The method of claim 1 wherein said metallic elements comprise europium, barium and copper in a 1-2-3 ratio, respectively.

* * * * *